US008206998B2

(12) United States Patent
Kato et al.

(10) Patent No.: US 8,206,998 B2

(45) Date of Patent: Jun. 26, 2012

(54) METHOD FOR MANUFACTURING LIQUID DISCHARGE HEAD

(75) Inventors: Masataka Kato, Hiratsuka (JP); Kazuhiro Hayakawa, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 253 days.

(21) Appl. No.: 12/789,640

(22) Filed: May 28, 2010

(65) Prior Publication Data

US 2010/0323463 A1 Dec. 23, 2010

(30) Foreign Application Priority Data

Jun. 17, 2009 (JP) ................................. 2009-144149

(51) Int. Cl.
*H01L 21/00* (2006.01)

(52) U.S. Cl. ................................. 438/21; 257/E21.233

(58) Field of Classification Search .................... 438/21, 438/198; 257/E21.233

See application file for complete search history.

(56) References Cited

U.S. PATENT DOCUMENTS

| | | | | |
|---|---|---|---|---|
| 6,569,343 | B1 * | 5/2003 | Suzuki et al. | 438/464 |
| 6,672,712 | B1 | 1/2004 | Donaldson et al. | |
| 6,863,834 | B2 * | 3/2005 | Hiroki et al. | 438/21 |
| 2005/0083372 | A1 | 4/2005 | Obert et al. | |
| 2008/0018713 | A1 | 1/2008 | Lopez et al. | |
| 2009/0096845 | A1 | 4/2009 | Braun et al. | |

FOREIGN PATENT DOCUMENTS

JP 10138478 A 5/1998

* cited by examiner

*Primary Examiner* — Chandra Chaudhari

(74) *Attorney, Agent, or Firm* — Fitzpatrick, Cella, Harper & Scinto

(57) ABSTRACT

A method for manufacturing a substrate for a liquid discharge head provided with a silicon substrate and a supply port, including: providing the silicon substrate having an insulating layer on a first surface and an etching mask layer having a plurality of apertures on a second surface which is a rear surface of the first surface, wherein the insulating layer is provided in a region ranging from a position opposing the apertures to a position opposing a portion between the adjacent apertures of the mask layer; and forming holes by etching a silicon part of the silicon substrate so that an etched region reaches a portion of the insulating layer opposing the apertures, wherein the silicon wall provided between the adjacent holes is etched so that the portion in the first surface side thereof can be thinner than the portion in the second surface side thereof.

5 Claims, 6 Drawing Sheets

METHOD FOR MANUFACTURING LIQUID DISCHARGE HEAD

BACKGROUND OF THE INVENTION

1. Field of the Invention

The present invention relates to a method for manufacturing a liquid discharge head which discharges a liquid.

2. Description of the Related Art

As for one example of a method for manufacturing a liquid discharge head, Japanese Patent Application Laid-Open No. H10-138478 discloses a method of anisotropically etching a silicon substrate having a face orientation of {110} to form a plurality of supply ports which are through holes in the silicon substrate and simultaneously use a silicon part having been left in between the supply ports as a beam. It can be considered that the decrease of the strength due to the through holes provided in the silicon substrate is alleviated by providing the beam.

However, in the above described method, the beams having the same width separate the plurality of the supply ports from each other in regions ranging from the rear surface of the silicon substrate to the front surface thereof. Therefore, the volume of the supply port part cannot be sufficiently secured because of the existence of the beam, and the refilling of the liquid may become insufficient.

SUMMARY OF THE INVENTION

For this reason, an object of the present invention is to provide a method for manufacturing a substrate which can be used for a liquid discharge head superior in mechanical strength and refilling performance.

A method for manufacturing a substrate for a liquid discharge head provided with a silicon substrate having an energy-generating element which generates energy utilized for discharging a liquid on a first surface side, and a supply port for supplying the liquid to the energy-generating element, comprising the followings in this order: providing the silicon substrate having an insulating layer consisting of an insulating material on the first surface and an etching mask layer having a plurality of apertures on a second surface which is a rear surface of the first surface, wherein the insulating layer is provided in a region ranging from a position opposing to the apertures to a position opposing to a portion between the adjacent apertures of the mask layer; and forming holes to be the supply ports corresponding to the plurality of the adjacent apertures by etching a silicon part of the silicon substrate from the plurality of the apertures with a reactive ion etching technique so that an etched region reaches a portion of the insulating layer opposing to the apertures, while using the etching mask layer as a mask, wherein the silicon wall provided between the adjacent holes is etched with the reactive ion etching technique so that the portion in the first surface side thereof can be thinner than the portion in the second surface side thereof.

According to the present invention, a substrate for a liquid discharge head superior in mechanical strength and refilling performance can be manufactured.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

The present invention provides a method for manufacturing a substrate for a liquid discharge head which has a plurality of liquid supply ports formed in a silicon substrate and beams which are formed of a material of the silicon substrate and are formed between adjacent liquid supply ports. The liquid supply ports are plurally formed in a longitudinal direction of the substrate. The beam is formed so as to connect long sides of the substrate to each other. Because the beam is provided in the liquid supply ports, the deformation of the substrate can be suppressed and the misalignment of the discharge ports can be decreased. The beam can also increase the mechanical strength, and can avoid damages in handling and mounting.

The above described beam is formed as if having been dropped into the silicon substrate. In other words, the beam is formed so as to have a space from the surface of the silicon substrate, and a step is provided by the upper part of the beam and the surface of the silicon substrate. Because the beam is formed as if having been dropped into the silicon substrate, the refilling performance of the liquid discharge head can be enhanced. Accordingly, the liquid discharge head having the substrate to be manufactured according to the present invention can adequately print characters, and can record the characters with high accuracy and at high speed.

In the present invention, a plurality of the liquid supply ports are formed by the operation of etching the silicon substrate from the rear surface until the etched hole reaches an etching stop layer (hereinafter also referred to as an insulating layer) having insulation properties, with a reactive ion etching technique. Then, the beam is formed by the operation of further notching and removing the silicon substrate part in the lower side of the etching stop layer having the insulation properties with the reactive ion etching technique to make adjacent liquid supply ports communicate with each other.

Figure 9:
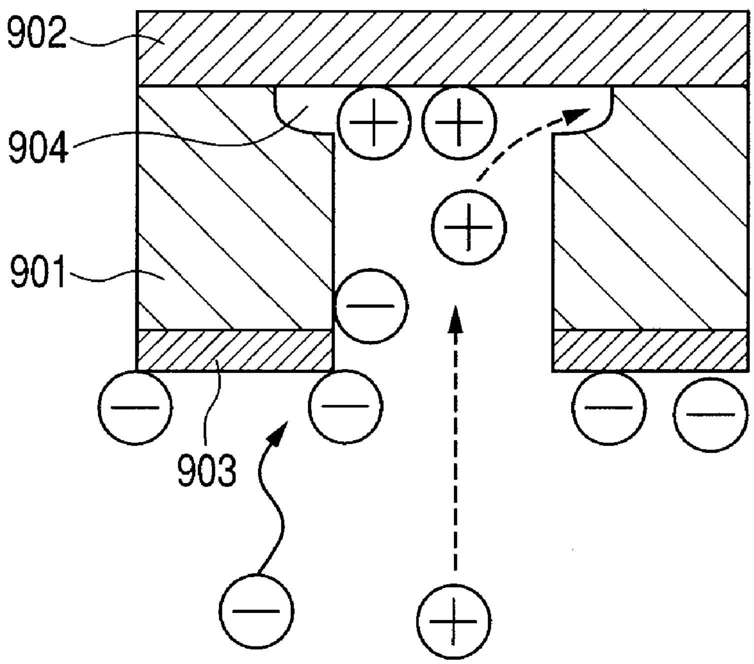
FIG. 9 is a sectional view for describing a notching phenomenon which occurs in a dry etching step.

Here, the principle of the present invention will be described below with reference to FIG. 9. In FIG. 9, an etching stop layer 902 which has a high etching selection ratio to an etching gas and has insulation properties, such as a silicon oxide film and a silicon nitride film, is formed on the surface of a silicon substrate 901. In addition, an etching mask 903 having an aperture part is formed on the rear surface of the silicon substrate 901. As is illustrated in FIG. 9, when the silicon substrate 901 is etched from the rear surface thereof with the reactive ion etching technique, the silicon substrate 901 is etched (notched) toward a side face direction in the interface between the silicon substrate 901 and the etching stop layer 902 having the insulation properties, due to the electrostatic charge as illustrated in FIG. 9. In FIG. 9, a space 904 is shown which is formed by the removal of the silicon substrate part due to notching.

In the present invention, the substrate is dug and the beam is formed, by applying this principle to the silicon substrate. The process will be described more in detail below. The silicon substrate is etched from the rear surface thereof toward an etching stop layer having insulation properties with a reactive ion etching technique, and then is etched in a transverse direction due to a caused notching phenomenon. When the etching reaction in a transverse direction is further proceeded, the adjacent liquid supply ports are communicated with each other and the beam can be formed. The beam which has been formed in the silicon substrate according to this method has its upper part lower than the surface of the substrate, which increases the sectional area of a liquid flow channel. Therefore, the resistance of the flow can be decreased and a period of time necessary for refilling the liquid discharge head with the liquid can be shortened.

Accordingly, the method according to the present invention can easily form a substrate for a liquid discharge head having a beam whose upper part is lower than the surface of the substrate.

The insulating layer is arranged so that the upside of the silicon substrate between the plurality of the liquid supply ports can be removed by the notching phenomenon and the adjacent liquid supply ports can be connected with each other through the formed space. In addition, the insulating layer can be formed at least on regions of the silicon substrate, one of which corresponds to an upper side of a region under which a beam is formed, and the other of which corresponds to a region where the beam is formed, in the surface aperture of the liquid supply port that is formed by the etching of the silicon substrate until the etched hole reaches the insulating layer.

In the present invention, it is desirable to concomitantly use also an etching stop layer having electroconductivity. In FIG. 9, the case was described in which the etching stop layer was the insulating layer, but when the etching stop layer (hereinafter also referred to as an electroconductive layer) has electroconductivity, the notching phenomenon does not occur. In other words, when the etching stop layer made from aluminum or gold which is less etched than the silicon substrate and has high electroconductivity exists on the surface of the silicon substrate, the electrostatic charge by ions does not occur in the interface of the substrate and the etching stop layer having electroconductivity and the notching phenomenon does not occur. The electroconductive layer can be formed on the surface of the silicon substrate in a portion at which the notching phenomenon is not desired to occur, by using this principle. In other words, the notching phenomenon is prevented from occurring due to reactive ion etching in the region in which the electroconductive layer has been formed, and the notching phenomenon can be caused in the region in which the insulating layer has been formed.

The liquid supply port and the beam are formed with high accuracy by using the electroconductive layer and the insulating layer, and thereby, a distance between a discharge-energy-generating element and a liquid supply port which communicates with the liquid flow channel (hereinafter referred to as CH distance) can be controlled with high accuracy, which uniformizes discharge frequency characteristics.

Furthermore, the aperture of the liquid supply port on the rear surface of the substrate can be formed with a smaller dimension than a dimension of the case in which the aperture of the liquid supply port has been formed with the use of a conventional anisotropic etching technique. Therefore, a wider area can be used as an adhesion area in the rear surface.

Exemplary embodiments of the present invention will be described below with reference to the drawings. In addition, in the following description, the substrate for the ink jet recording head may be taken as an application example of the substrate for the liquid discharge head, for description. However, the scope to which the present invention is applied is not limited to the substrate for the ink jet recording head, but the present invention can be applied also to a substrate which can be used for a liquid discharge head for applications of manufacturing a biochip and printing an electronic circuit. The liquid discharge head includes, for instance, a head for manufacturing a color filter, in addition to the ink jet recording head.

Embodiment 1

Figure 10:
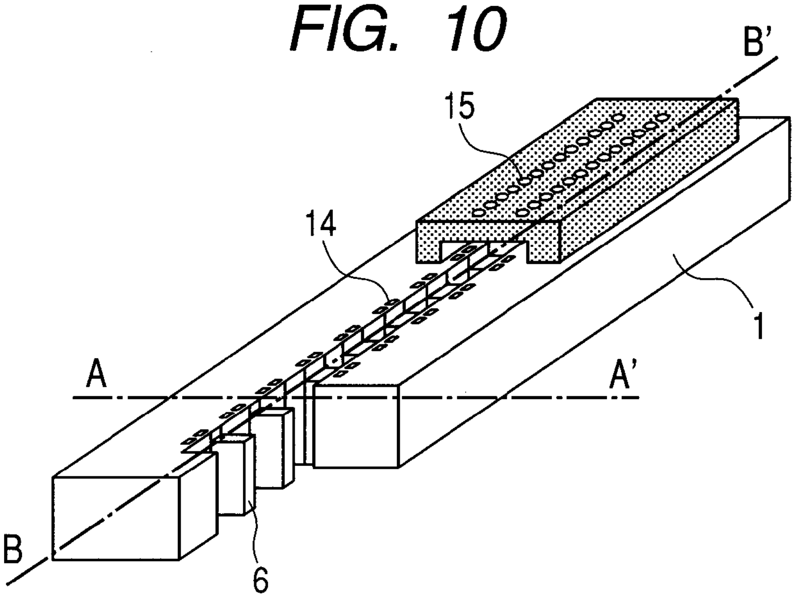
FIG. 10 is a schematic perspective view illustrating one example of a liquid discharge head according to the present invention.
Figure 11:
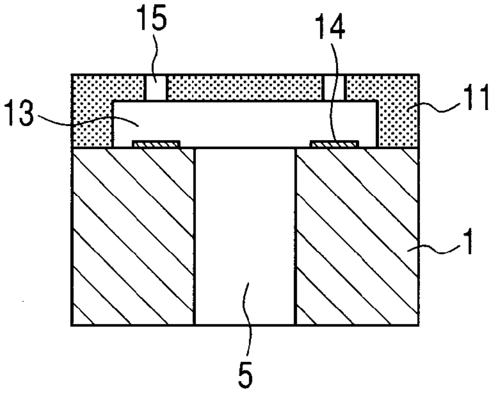
FIG. 11 is a schematic sectional view illustrating one example of a liquid discharge head according to the present invention.
Figure 12:
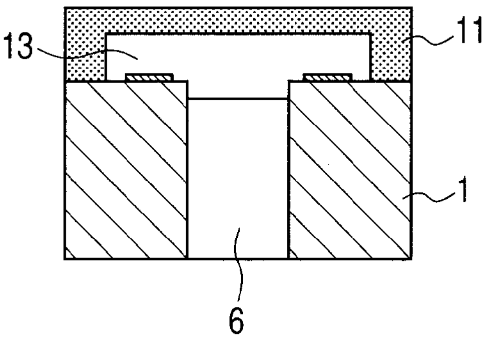
FIG. 12 is a schematic sectional view illustrating one example of the liquid discharge head according to the present invention.
Figure 13:
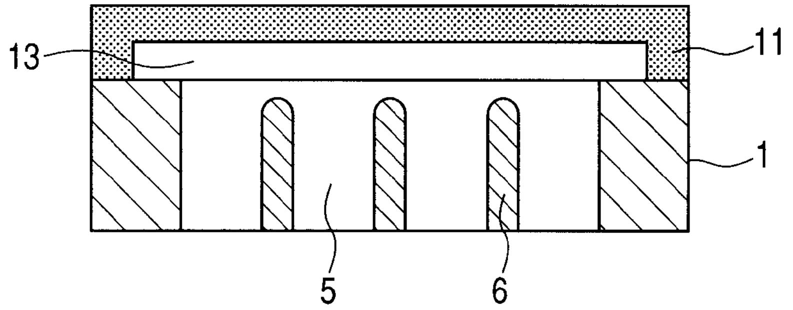
FIG. 13 is a schematic sectional view illustrating one example of the liquid discharge head according to the present invention.

Firstly, a substrate for a liquid discharge head to be manufactured according to the present invention will be described below. An ink jet recording head with the use of the substrate to be manufactured according to the present invention is shown in FIGS. 10 to 13. FIG. 10 is a perspective view of the ink jet recording head, one part of which is cut away, and FIG. 11 is a sectional view taken along the line A-A' of FIG. 10. FIG. 12 is a sectional view taken along a line parallel to the A-A' line of FIG. 10, in a region in which the beam is formed. FIG. 13 is a sectional view taken along the line B-B' of FIG. 10.

The ink jet recording head has a silicon substrate 1 in which a plurality of discharge-energy-generating elements 14 for generating a pressure for discharging ink (droplets) are formed, as is illustrated in FIGS. 10 to 13. The silicon substrate 1 has a semiconductor circuit including a transistor for driving the discharge-energy-generating element 14, an electrode pad for electrically connecting a recording head with the body side of a recording apparatus and the like formed thereon, but they are omitted in each figure for clarifying the drawings. The substrate for the ink jet recording head includes the silicon substrate 1. The silicon substrate 1 has the discharge-energy-generating element 14 formed thereon. An ink flow channel 13 is communicated with a discharge port 15 and a liquid supply port 5, and is formed by a flow-channel-forming layer (an orifice plate) 11 having the discharge port 15. Ink supply ports 5 for supplying ink to the ink flow channel 13 are plurally formed on the silicon substrate 1 so as to form a line in a longitudinal direction, and beams 6 are formed between each of the ink supply ports. The beam 6 is formed so that the upper part of the beam is lowered from the surface of the silicon substrate (so as to have a step).

Embodiment 2

Next, a method for manufacturing a substrate for a liquid discharge head according to the present invention will be described below with reference to FIGS. 1A to 3. In the following description, the case will be described in which a flow-channel-forming layer and the like are not formed on the silicon substrate. However, the present invention is not limited to the case in particular, but the flow-channel-forming layer and the like may be formed on the silicon substrate. In other words, it is also possible to regard the present invention as a method for manufacturing the liquid discharge head.

FIGS. 1A to 1H are sectional views for describing a state in each step of a method for manufacturing a substrate for a liquid discharge head according to Embodiment 2 of the present invention, and FIGS. 1A to 1D are sectional views corresponding to FIG. 13 which has been described above. In addition, FIGS. 1E to 1H are sectional views of the rear surface 50 of the substrate 1. FIG. 2 is a schematic view illustrating a layout of an insulating layer 2 and an electroconductive layer 3 formed on a surface 51 of the silicon substrate 1.

Figure 1A:
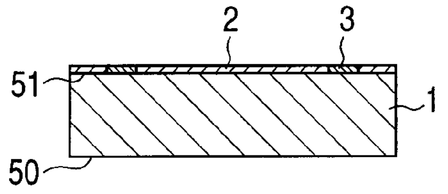
FIGS. 1A, 1B, 1C, 1D, 1E, 1F, 1G and 1H are schematic sectional views illustrating one example of a process of manufacturing a substrate for a liquid discharge head according to one embodiment of the present invention.
Figure 1B:
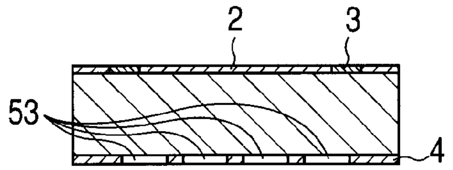
Figure 1C:
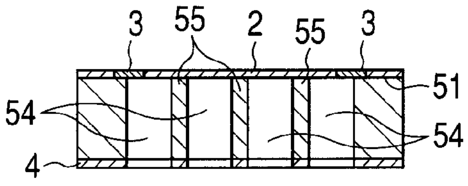
Figure 1D:
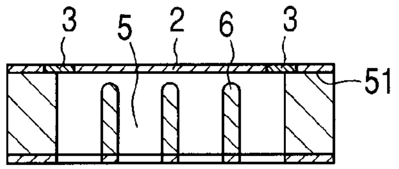
Figure 1E:
Figure 2:
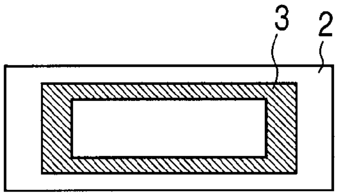
FIG. 2 is a schematic view illustrating a state in the process of manufacturing the substrate for the liquid discharge head according to one embodiment of the present invention.

Firstly, the insulating layer 2 and the electroconductive layer 3 are formed on the surface 51 of the silicon substrate 1, as is illustrated in FIGS. 1A and 1E and FIG. 2. As is illustrated in the Figures, the insulating layer 2 and the electroconductive layer 3 are formed on the silicon substrate 1 so that only the upper part of a region under which a beam is formed can be notched. The insulating layer 2 is formed at least on the upper sides of a plurality of regions under which the beams are formed, on the silicon substrate 1 along a longitudinal direction. The electroconductive layer 3 is formed on the upper side of a wall face of the liquid supply port to be formed in the posterior step, except the wall face which forms the beam.

Materials of the insulating layer 2 include silicon oxide and silicon nitride.

The electroconductive layer 3 can employ, for instance, Al, Ta, TiW, Au, Cu and the like for the material.

The insulating layer 2 or the electroconductive layer 3 can be formed with a well-known method of producing a volume film by sputtering or the like, and patterning the volume film with a photolithographic method or the like.

Figure 14A:
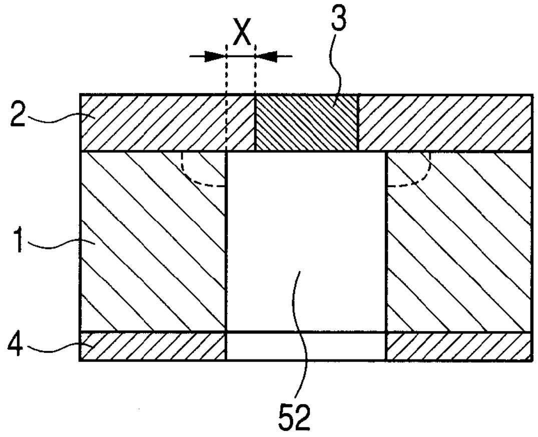
FIGS. 14A and 14B are schematic sectional views for describing a state in an etching step.

Here, in order to cause the notching phenomenon in a portion in the vicinity of the surface 51 of the silicon substrate 1 and remove the silicon in the relevant portion, the insulating layer 2 is desirably arranged in a region to be etched by dry etching, as is illustrated in FIG. 14A. For instance, in FIG. 14A, when the thickness of the silicon substrate 1 is 625 μm, the value of X can be set at 4 μm or more, further can be set at 10 μm or more, and still further can be set at 15 μm or more. In an airspace 52 formed by the removal of silicon by dry etching, the insulating layer 2 juts into a region to be dry-etched, which the notching phenomenon under the insulating layer 2.

Figure 14B:
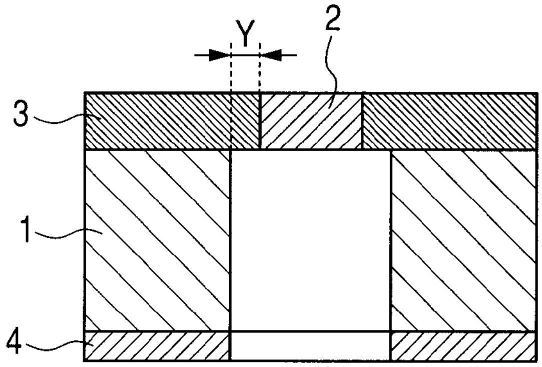

In addition, the electroconductive layer is desirably arranged so as to come to the inner side of the aperture of the liquid supply port on the surface of the substrate, as is illustrated in FIG. 14B, in order to prevent the notching phenomenon by the electroconductive layer. For instance, in FIG. 14B, the value of Y can be set at 4 μm or more, further can be set at 10 μm or more, and still further can be set at 15 μm or more.

Figure 1F:
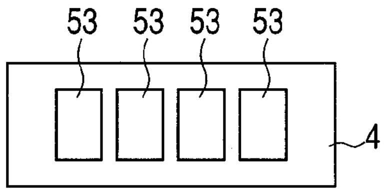

Next, as is illustrated in FIGS. 1B and 1F, an etching mask layer 4 is formed in a rear surface 50 side of the silicon substrate 1. The etching mask layer 4 has an aperture part 53 corresponding to the aperture of the liquid supply port on the rear surface, and the silicon surface exposed from this aperture part 53 becomes a starting face of reactive ion etching to be conducted in a posterior step.

In the above description, the order of the step of forming the insulating layer 2 and the electroconductive layer 3 and the step of forming the etching mask layer 4 is not limited in particular.

Figure 1G:
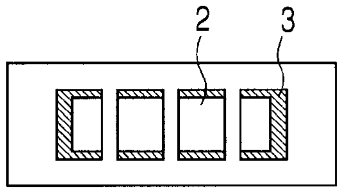

Next, as is illustrated in FIGS. 1C and 1G, the silicon substrate 1 is etched from the rear surface side thereof with the reactive ion etching technique until the etched hole reaches the insulating layer 2 and the electroconductive layer 3, and holes 54 corresponding to each aperture part 53 are plurally formed.

Here, the reactive ion etching technique according to the present invention is a directional etching technique with the use of ions, and is a method of making particles collide against the region to be etched while providing electric charges. The reactive ion etching technique is a method of etching a substance with accelerated ions, and the apparatus is divided into a plasma source which produces the ions and a reaction chamber in which the ions etch the substance. For instance, when an ICP (inductively coupled plasma) dry etching apparatus which can produce a high-density ion is used as the ion source, coating and etching processes (in other words, deposition/etching processes) are alternately conducted, and a liquid supply port is formed perpendicularly to the substrate. In the deposition/etching process, $SF_6$ gas can be used as an etching gas, for instance, and $C_4F_8$ gas can be used as a coating gas, for instance. In the present invention, the liquid supply port can be formed by the dry etching technique with the use of the ICP plasma apparatus, but a dry etching apparatus having another type of plasma source may be used. For instance, an apparatus having an ECR (electron cyclotron resonance) ion source can also be used.

A gas having fluorine atom is preferably used as etching gas for reactive ion etchin. For example, the gas preferably includes at least one of SF6 gas, CF4 gas C4F8 gas and CHF3 gas. The mixture of these gases may be also used.

Next, the silicon substrate is further etched with the reactive ion etching technique, and the lower part of the insulating layer 2 of the silicon wall part 55 which separates holes 54 from each other is removed by the notching effect. Thereby, the wall part 55 is dug in an approximately parallel direction to the surface of the substrate.

Figure 8:
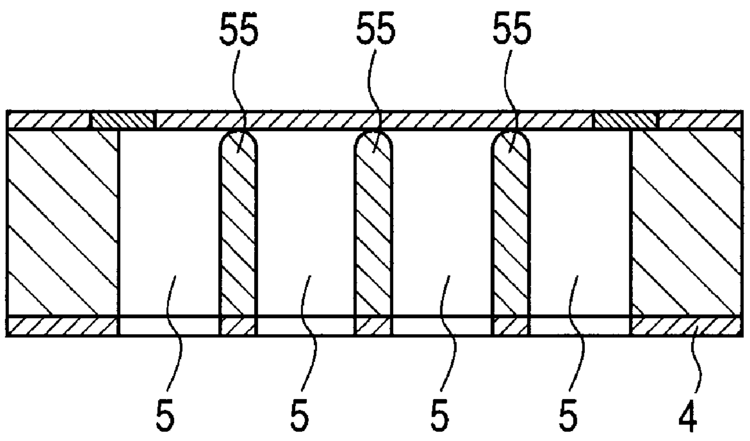
FIG. 8 is a schematic sectional view illustrating one example of the process of manufacturing the substrate for the liquid discharge head according to one embodiment of the present invention.

When the reactive ion etching operation is stopped in this state, a recess part can be formed in a substrate surface 51 side of the silicon wall part 55 so as to direct the inner part of the wall 55, as is illustrated in FIG. 8. Thereby, the resistance of the flow of the liquid in each supply port 5 can be lowered, which can enhance refilling characteristics.

Figure 1H:
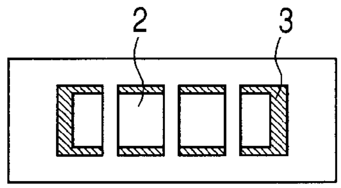

When the reactive ion etching operation is further continued, the adjacent holes 54 are communicated with each other, and the supply ports 55 which have been connected to form one channel and the beams 6 are formed, as is illustrated in FIGS. 1D and 1H.

Here, as for the conditions of reactive ion etching, the flow rate of $SF_6$ gas can be between 50 sccm and 1,000 sccm, the flow rate of $C_4F_8$ gas can be between 50 sccm and 1,000 sccm, and the pressure of the gases can be between 0.5 Pa and 50 Pa. When the conditions are controlled in these ranges, the notching phenomenon can be caused more effectively.

The width of the beam 6 (a distance between the liquid supply ports) can be set, for instance, at 5 to 100 μm, and further can be set at 10 to 40 μm. When the width is set at 20 μm or less, the adjacent liquid supply ports can be more easily communicated with each other by the notching effect. When the width is set at 10 μm or more, the mechanical strength of the substrate can be effectively enhanced.

Figure 3:
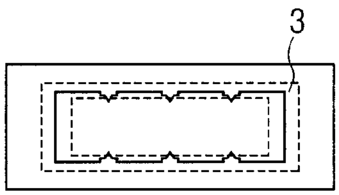
FIG. 3 is a schematic view illustrating a state in the process of manufacturing the substrate for the liquid discharge head according to one embodiment of the present invention.

FIG. 3 is a schematic view illustrating the aperture of the liquid supply port on the surface of the silicon substrate in which the beam has been formed by the notching effect. A region surrounded by two dotted lines corresponds to a portion in which the electroconductive layer 3 has been formed, and the notching phenomenon can be prevented in the portion.

The insulating layer 2 and the electroconductive layer 3 can be removed by a well-known method. When the electroconductive layer consists of Al, for instance, the electroconductive layer can be removed by a mixture liquid of phosphoric acid, nitric acid and acetic acid. When the insulating layer is removed, the supply port 50 is opened.

Embodiment 3

Embodiment 3 according to the present invention will be described below with reference to FIGS. 4A to 6. FIGS. 4A to 4H are sectional views for describing each process, FIGS. 4A to 4D are sectional views in the longitudinal direction corresponding to FIG. 13 which was described above, and FIGS. 4E to 4H are schematic views which have been observed from the lower side of the substrate. FIG. 5 is a schematic view illustrating shapes of an insulating layer and an electroconductive layer which have been formed on a surface of a silicon substrate.

Figure 4A:
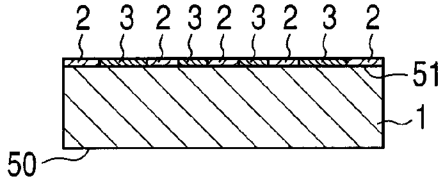
FIGS. 4A, 4B, 4C, 4D, 4E, 4F, 4G and 4H are schematic sectional views illustrating one example of a process of manufacturing a substrate for a liquid discharge head according to one embodiment of the present invention.
Figure 4B:
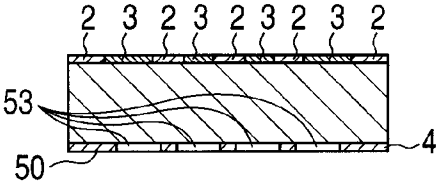
Figure 4C:
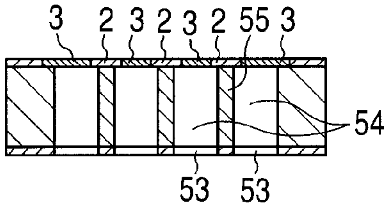
Figure 4D:
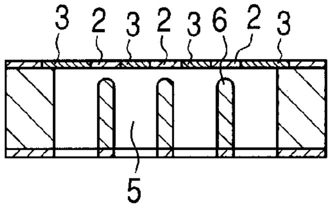
Figure 5:
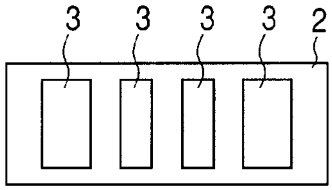
FIG. 5 is the schematic view illustrating a state in the process of manufacturing the substrate for the liquid discharge head according to one embodiment of the present invention.
Figure 4E:
Figure 4F:
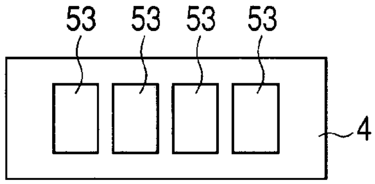
Figure 4G:
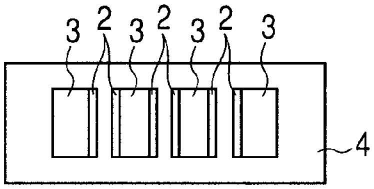
Figure 4H:
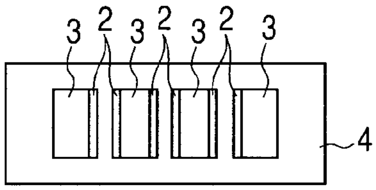

Firstly, as is illustrated n in FIGS. 4A and 4E and FIG. 5, the insulating layer 2 and the electroconductive layer 3 are formed on the silicon substrate 1. As is illustrated in the FIGS, the insulating layer 2 and the electroconductive layer 3 are formed on the silicon substrate 1 so that only the upper part of a region under which a beam is formed can be notched, and the insulating layer 2 is formed at least on the upper sides of a plurality of regions under which the beams are formed, on the silicon substrate 1. A rectangular electroconductive layer 3 is formed within the insulating layer 3. The electroconductive layer 3 and the aperture part 53 of an etching mask layer 4 are arranged so as to oppose to each other.

Figure 6:
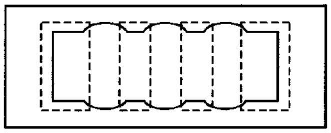
FIG. 6 is a schematic view illustrating a state in the process of manufacturing the substrate for the liquid discharge head according to one embodiment of the present invention.

The steps after this can be conducted in a similar way to those in Embodiment 1. FIG. 6 is a schematic view illustrating an aperture of a liquid supply port on the surface of the silicon substrate in which the beam has been formed by the notching effect. Regions surrounded by dotted lines correspond to the electroconductive layer 3, and the notching phenomenon can be prevented in the relevant portions. As is illustrated in Embodiments 2 and 3, a portion in which the notching phenomenon occurs can be controlled by the arrangement of the electroconductive layer and the insulating layer.

Embodiment 4

FIGS. 7A to 7G are schematic process views for describing an example of a method for, after forming the insulating layer 2 and the electroconductive layer 3 as described in Embodiment 3, forming a liquid supply port and a beam in a state in which a liquid-flow-channel mold 10 and a flow-channel-forming layer 11 are further formed thereon.

The thickness of the silicon substrate 1 can be set at 200 to 725 μm, for instance. In addition, a silicon substrate having the crystal orientation of (100) can be used.

Figure 7A:
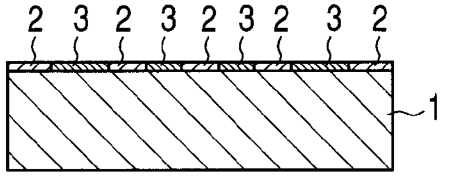
FIGS. 7A, 7B, 7C, 7D, 7E, 7F and 7G are schematic sectional views illustrating one example of a process of manufacturing a substrate for a liquid discharge head according to one embodiment of the present invention.

Firstly, as is illustrated in FIG. 7A, the insulating layer 2 and the electroconductive layer 3 are formed on the silicon substrate 1.

The film of the electroconductive layer 3 is formed by using Al, Ta, TiW, Au or Cu and the like, and the shape can be formed by patterning. The method of forming the film of Al includes, for instance, a sputtering method. A patterning method includes: masking the electroconductive layer 3 by a photolithographic process with the use of a novolak-based positive resist, for instance; and etching the electroconductive layer 3 by using a mixture liquid (product name C-6 made by Tokyo Ohka Kogyo Co., Ltd., for instance) of phosphoric acid, nitric acid and acetic acid. For instance, when the electroconductive layer consists of Ta, the film is formed through a sputtering method, and the electroconductive layer is removed by CDE (Chemical Dry Etching) after having been masked. For instance, when the electroconductive layer consists of TiW, Au or Cu, the electroconductive layer can be formed with a plating method which includes: forming a seed layer; masking the seed layer with a resist; and electrolytically plating the substrate. The electroconductive layer can be also formed by a method of patterning only a seed layer such as TiW.

The insulating layer 2 can use silicon oxide, silicon nitride and the like for its material. For instance, a film of silicon nitride can be formed by LPCVD (Low Pressure Chemical Vapor Deposition), after the electroconductive layer has been formed with the above described method. The insulating layer 2 can be then formed by a photolithographic process and RIE with the use of $CF_4$ gas. When the insulating layer 2 consists of silicon oxide, the film can be formed, for instance, with a plasma CVD method. The film can be removed by a buffered hydrofluoric acid, after the film has been formed with a plasma CVD method.

Figure 7B:
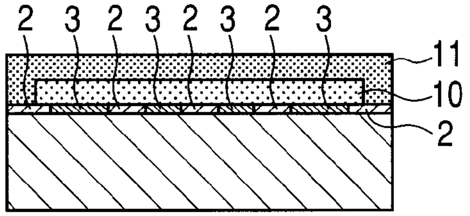

Next, polymethyl isopropenyl ketone which is a UV resist capable of eluting is solvent-coated on the insulating layer 2 and the electroconductive layer 3, with a spin coating method, as is illustrated in FIG. 7B. This resist is exposed to a UV light and developed to form a liquid-flow-channel mold 10.

Then, a cationic polymerization type epoxy resin which is a negative resist is applied on the liquid-flow-channel mold 10 to form a flow-channel-forming layer (an orifice plate) 11 which forms a liquid flow channel. A discharge port (unshown) can be formed in this negative resist by exposing the negative resist to light through a photomask having a predetermined pattern and developing the exposed negative resist. The negative resist corresponding to an electrode pad portion can be also removed in a similar way.

Figure 7C:
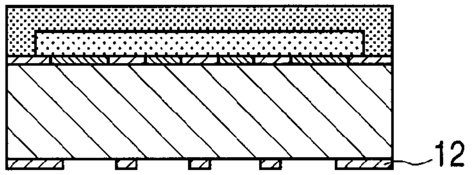

Next, as is illustrated in FIG. 7C, an etching mask layer is formed on the rear surface of the silicon substrate 1. The etching mask layer can use, for instance, a novolak-based positive resist as its material. A film of the etching mask layer may also be formed by forming a silicon oxide film, a silicon nitride film, an epoxy resin film or a metal film with a vapor-deposition technique or a sputtering technique.

Figure 7D:
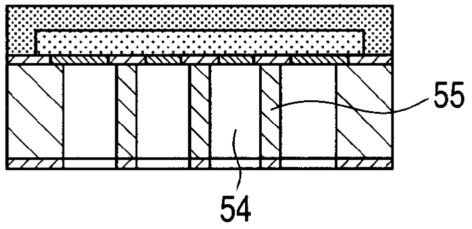

Next, as is illustrated in FIG. 7D, holes 54 are formed by etching the silicon substrate from the rear surface thereof until the etched holes reach the insulating layer 2 and the electroconductive layer 3 with a reactive ion etching technique.

Figure 7E:
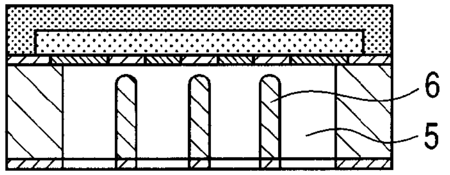

Next, as is illustrated in FIG. 7E, the reactive ion etching process is further proceeded to remove a portion of the silicon substrate in the lower part of the insulating layer by the notching effect, communicate the adjacent holes 54 with each other and form the beam 6. The portion contacting the insulating layer 2 of the wall 55 between the adjacent holes 54 is removed by the notching phenomenon, and thereby, the adjacent holes 54 are communicated with each other. Through the above steps, the supply port 5 containing the beam 6 therein is formed. In this case, as was described in FIG. 9, the insulating layer is electrostatically charged in the interface of the silicon substrate 1 and the insulating layer 2 by ions drawn by bias, so the silicon substrate is progressively etched (notched) toward a side wall direction. On the other hand, the electroconductive layer 3 is not electrostatically charged in the interface of the silicon substrate 1 and the electroconductive layer 3, so the notching phenomenon does not occur.

Figure 7F:
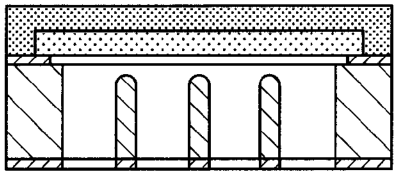

Next, as is illustrated in FIG. 7F, the exposed electroconductive layer 3 and the insulating layer 2 are removed. As for a removing method, when the electroconductive layer consists of Al, the electroconductive layer can be removed, for instance, by using a mixture liquid of phosphoric acid, nitric acid and acetic acid. In this case, from the viewpoint of removing Al which is exposed in an aperture and has a high aspect ratio, a liquid having as low viscosity as possible is desirably used for the removal. When the electroconductive layer consists of Ta, for instance, the electroconductive layer can be removed with an etching method such as CDE. When the electroconductive layer consists of TiW, a mixture liquid of hydrogen peroxide water or neutral ammonium fluoride and sulfuric acid or the like can be used as an etchant. When the electroconductive layer consists of Au, for instance, a mixture liquid of iodine, potassium iodide and IPA, a potassium cyanide solution or the like can be used as an etchant. Furthermore, when the electroconductive layer consists of Cu, for instance, nitric acid, fluoric acid or the like can be used as an etchant. The insulating layer includes silicon oxide or silicon nitride. When the insulating layer consists of silicon oxide, for instance, the insulating layer can be removed by buffered hydrofluoric acid. When the insulating layer consists of silicon nitride, for instance, the insulating layer can be removed by CDE with the use of $CF_4$ gas.

Figure 7G:
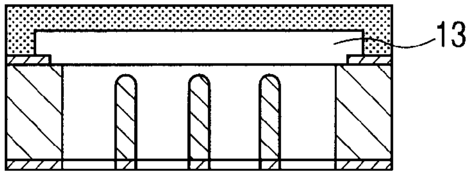

Next, as is illustrated in FIG. 7G, the liquid-flow-channel mold 10 is removed. The liquid-flow-channel mold 10 can be removed, for instance, by being irradiated with UV and being immersed in methyl lactate to which an ultrasonic wave is applied.

For information, such substrates can be plurally and simultaneously formed, though being not shown in particular, on a silicon wafer including the silicon substrates 1. The substrates are cut out from the wafer by dicing in the end, and can be used as a liquid discharge head.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-144149, filed Jun. 17, 2009, which is hereby incorporated by reference herein in its entirety.

What is claimed is:

1. A method for manufacturing a substrate for a liquid discharge head provided with a silicon substrate having an energy-generating element which generates energy utilized for discharging a liquid on a first surface side, and a supply port for supplying the liquid to the energy-generating element, comprising the following in this order:

providing the silicon substrate having an insulating layer consisting of an insulating material on the first surface and an etching mask layer having a plurality of apertures on a second surface which is a rear surface of the first surface, wherein the insulating layer is provided in a region ranging from a position opposing the inside of the aperture to a position opposing a portion between the adjacent apertures of the mask layer;

and forming holes to be the supply ports corresponding to the plurality of the adjacent apertures by etching a silicon part of the silicon substrate from the plurality of the apertures with a reactive ion etching technique so that an etched region reaches a portion opposing the inside of the aperture of the insulating layer, while using the etching mask layer as a mask, wherein the silicon wall provided between the adjacent holes is etched with the reactive ion etching technique so that the portion in the first surface side thereof can be thinner than the portion in the second surface side thereof.

2. The method according to claim 1, wherein the silicon substrate is etched with the reactive ion etching technique so that the adjacent holes are separated from each other by the wall in the second surface side and are communicated with each other in the first surface side.

3. The method according to claim 1, wherein an etching gas which is used in the reactive ion etching technique includes a compound having a fluorine atom.

4. The method according to claim 3, wherein the fluorocarbon-based gas includes at least one of SF6 gas, CF4 gas C4F8 gas and CHF3 gas.

5. The method according to claim 1, wherein the portion in the first surface side of the silicon wall is thinned by the notching effect.

* * * * *